(12) United States Patent
Huang et al.

(10) Patent No.: US 11,190,192 B1
(45) Date of Patent: Nov. 30, 2021

(54) ELECTRONIC DEVICE WITH FAULT AND SOFT ERROR TOLERANT DELAY-LOCKED LOOPS

(71) Applicant: NATIONAL TSING HUA UNIVERSITY, Hsinchu (TW)

(72) Inventors: Shi-Yu Huang, Hsinchu (TW); Jun-Yu Yang, Changhua County (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 17/064,276

(22) Filed: Oct. 6, 2020

(51) Int. Cl.
*H03L 7/081* (2006.01)

(52) U.S. Cl.
CPC .................. *H03L 7/0816* (2013.01)

(58) Field of Classification Search
CPC ... H03L 7/07; H03L 7/22; H03L 7/087; H03L 7/0814; H03L 7/0995; H03L 7/0812; H03L 7/085; H03L 7/10; H03L 7/18; H03L 7/0805; H03L 7/089; H03L 7/0891; G06F 1/10; G06F 1/16; G06F 1/04; H03K 5/133; H03K 5/1565; H03K 5/131; H03K 5/1252; H04L 7/0337; H04L 7/033; H04L 7/0025; H04L 7/0331
USPC ........................................ 327/156, 158, 161
See application file for complete search history.

(56) References Cited

U.S. PATENT DOCUMENTS 7,342,521 B1 * 3/2008 Liu .......................... H03L 7/07
341/100
7,512,871 B1 3/2009 Carmichael et al.

OTHER PUBLICATIONS

Taiwan Patent Office, Office Action, Patent Application Serial No. 109135135, dated Jul. 14, 2021, Taiwan.

* cited by examiner

*Primary Examiner* — John W Poos

(57) ABSTRACT

An electronic device includes three delay-locked loops, three dummy voter circuits, and a voter circuit. Each of the three delay-locked loops has a first input end, a second input end, an output end to maintain the phase difference between the reference clock signal received from the first input end and the intermediate clock signal output from the output end. Each of the three voter circuits is connected between the second input end and the output end of each of the three delay-locked loops to delay the phase of the intermediate clock signal by the phase difference. The voter circuit receives the intermediate clock signal from each of the three delay-locked loops, and outputs an output clock signal according to the logic of the intermediate clock signal from each of the three delay-locked loops. The phase difference compensates for the phase delay of the intermediate clock signal passing through the voter circuit.

17 Claims, 5 Drawing Sheets

110

112

114

116

ELECTRONIC DEVICE WITH FAULT AND SOFT ERROR TOLERANT DELAY-LOCKED LOOPS

FIELD OF THE INVENTION

The invention relates in general to an electronic device, and in particular it relates to an electronic device with fault and soft error tolerant delay-locked loops (DLL).

DESCRIPTION OF THE RELATED ART

A modern high-end IC could consist of a number of functional dies integrated on a silicon substrate. If the functional dies are designed and fabricated with different processing technologies, then heterogeneous integration is needed. In addition to the clock distribution network in each functional die, other complementary timing circuits such as Delay-Locked Loop (DLL) are often used to perform clock synchronization. In other words, the DLL can be used to compensate for the clock latency differences in different functional dies.

To achieve a robust IC with a very high reliability, various Fault and Soft Error Tolerance schemes (referred to as FET schemes) for the DLL are needed. Even though the FET schemes for the memory and the logic blocks are well-known in the prior art, the FET schemes for the clock subsystem are less developed and addressed.

BRIEF SUMMARY OF THE INVENTION

In order to resolve the issues described above, an embodiment of the invention provides an electronic device including three delay-locked loops, three dummy voter circuits, and a voter circuit. Each of the three delay-locked loops has a first input end, a second input end, and an output end to maintain the phase difference between the reference clock signal received from the first input end and the intermediate clock signal output from the output end. Each of the three dummy voter circuits is connected between the second input end and the output end of each of the three delay-locked loops to delay the phase of the intermediate clock signal by the phase difference. The voter circuit receives the intermediate clock signal from each of the three delay-locked loops, and outputs an output clock signal according to the logic of the intermediate clock signal from each of the three delay-locked loops. The phase difference compensates for the phase delay caused by the intermediate clock signal passing through the voter circuit, so that the output clock signal is synchronized with the reference clock signal.

According to the electronic device disclosed above, the voter circuit outputs a logic high signal only when more than two intermediate clock signals from the three delay-locked loops are logic high signals.

According to the electronic device disclosed above, the three delay-locked loops include a first delay-locked loop, a second delay-locked loop and a third delay-locked loop. The three dummy voter circuits include a first dummy voter circuit, a second dummy voter circuit, and a third dummy voter circuit. The voter circuit includes a first NAND gate, a second NAND gate, a third NAND gate, and a fourth NAND gate.

According to the electronic device disclosed above, all the output ends of the first NAND gate, the second NAND gate, and the third NAND gate are connected to the input ends of the fourth NAND gate.

According to the electronic device disclosed above, the first NAND gate receives the intermediate clock signals from the first delay-locked loop and the second delay-locked loop. The second NAND gate receives the intermediate clock signals from the second delay-locked loop and the third delay-locked loop. The third NAND gate receives the intermediate clock signals from the first delay-locked loop and the third delay-locked loop.

According to the electronic device disclosed above, the fourth NAND gate outputs the output clock signal according to the logics of the intermediate clock signals from the first delay-locked loop, the second delay-locked loop, and the third delay-locked loop.

According to the electronic device disclosed above, the logical equation between the intermediate clock signals and the output clock signal is equal to: $clk\_out = \phi 1 * \phi 2 + \phi 2 * \phi 3 + \phi 3 * \phi 1$. $clk\_out$ is the logic of the output clock signal; $\phi 1$ is the logic of the intermediate clock signal from the first delay-locked loop; $\phi 2$ is the logic of the intermediate clock signal from the second delay-locked loop; $\phi 3$ is the logic of the intermediate clock signal from the third delay-locked loop.

According to the electronic device disclosed above, the first dummy voter circuit is connected between the second input end and the output end of the first delay-locked loop. The second dummy voter circuit is connected between the second input end and the output end of the second delay-locked loop. The third dummy voter circuit is connected between the second input end and the output end of the third delay-locked loop.

According to the electronic device disclosed above, each of the first dummy voter circuit, the second dummy voter circuit, and the third dummy voter circuit includes: a fifth NAND gate, a sixth NAND gate, a seventh NAND gate, and an eighth NAND gate.

According to the electronic device disclosed above, all the output ends of the fifth NAND gate, the sixth NAND gate, and the seventh NAND gate are connected to the input ends of the eighth NAND gate.

According to the electronic device disclosed above, the fifth NAND gate of the first dummy voter circuit receives the intermediate clock signal from the first delay-locked loop and a logic high signal. The sixth NAND gate of the first dummy voter circuit receives the logic high signal and a logic low signal. The seventh NAND gate of the first dummy voter circuit receives the intermediate clock signal from the first delay-locked loop and the logic low signal.

According to the electronic device disclosed above, the fifth NAND gate of the second dummy voter circuit receives the intermediate clock signal from the second delay-locked loop and a logic high signal. The sixth NAND gate of the second dummy voter circuit receives the intermediate clock signal from the second delay-locked loop and a logic low signal. The seventh NAND gate of the second dummy voter circuit receives the logic high signal and the logic low signal.

According to the electronic device disclosed above, the fifth NAND gate of the third dummy voter circuit receives a logic high signal and a logic low signal. The sixth NAND gate of the third dummy voter circuit receives the logic low signal and the intermediate clock signal from the third delay-locked loop. The seventh NAND gate of the third dummy voter circuit receives the logic high signal and the intermediate clock signal from the third delay-locked loop.

According to the electronic device disclosed above, the eighth NAND gate of the first dummy voter circuit outputs a first compensate clock signal to the second input end of the first delay-locked loop according to the logic of the intermediate signal from the first delay-locked loop. The eighth NAND gate of the second dummy voter circuit outputs a second compensate clock signal to the second input end of the second delay-locked loop according to the logic of the intermediate signal from the second delay-locked loop. The eighth NAND gate of the third dummy voter circuit outputs a third compensate clock signal to the second input end of the third delay-locked loop according to the logic of the intermediate signal from the third delay-locked loop.

According to the electronic device disclosed above, each of the three delay-locked loops includes: a phase detector, a controller, and a tunable delay line. The phase detector compares phases between the reference clock signal and a compensate clock signal, and outputs an indication signal according to a comparison result. The compensate signal is a signal which is obtained after one of the dummy voter circuits delays the intermediate clock signal by the phase difference. The controller outputs a control code according to the indication signal. The tunable delay line delays the reference clock signal according to the control code to generate the intermediate clock signal.

According to the electronic device disclosed above, the indication signal uses a bit to show that the phase of the reference signal leads or lags behind that of the compensate clock signal.

According to the electronic device disclosed above, the phase delay of the intermediate clock signal from the first delay-locked loop passing through the voter circuit is the same as that of the intermediate clock signal from the first delay-locked loop passing through the first dummy voter circuit. The phase delay of the intermediate clock signal from the second delay-locked loop passing through the voter circuit is the same as that of the intermediate clock signal from the second delay-locked loop passing through the second dummy voter circuit. The phase delay of the intermediate clock signal from the third delay-locked loop passing through the voter circuit is the same as that of the intermediate clock signal from the third delay-locked loop passing through the third dummy voter circuit.

BRIEF DESCRIPTION OF THE DRAWINGS

The invention can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration.

DETAILED DESCRIPTION OF THE INVENTION

Figure 1:
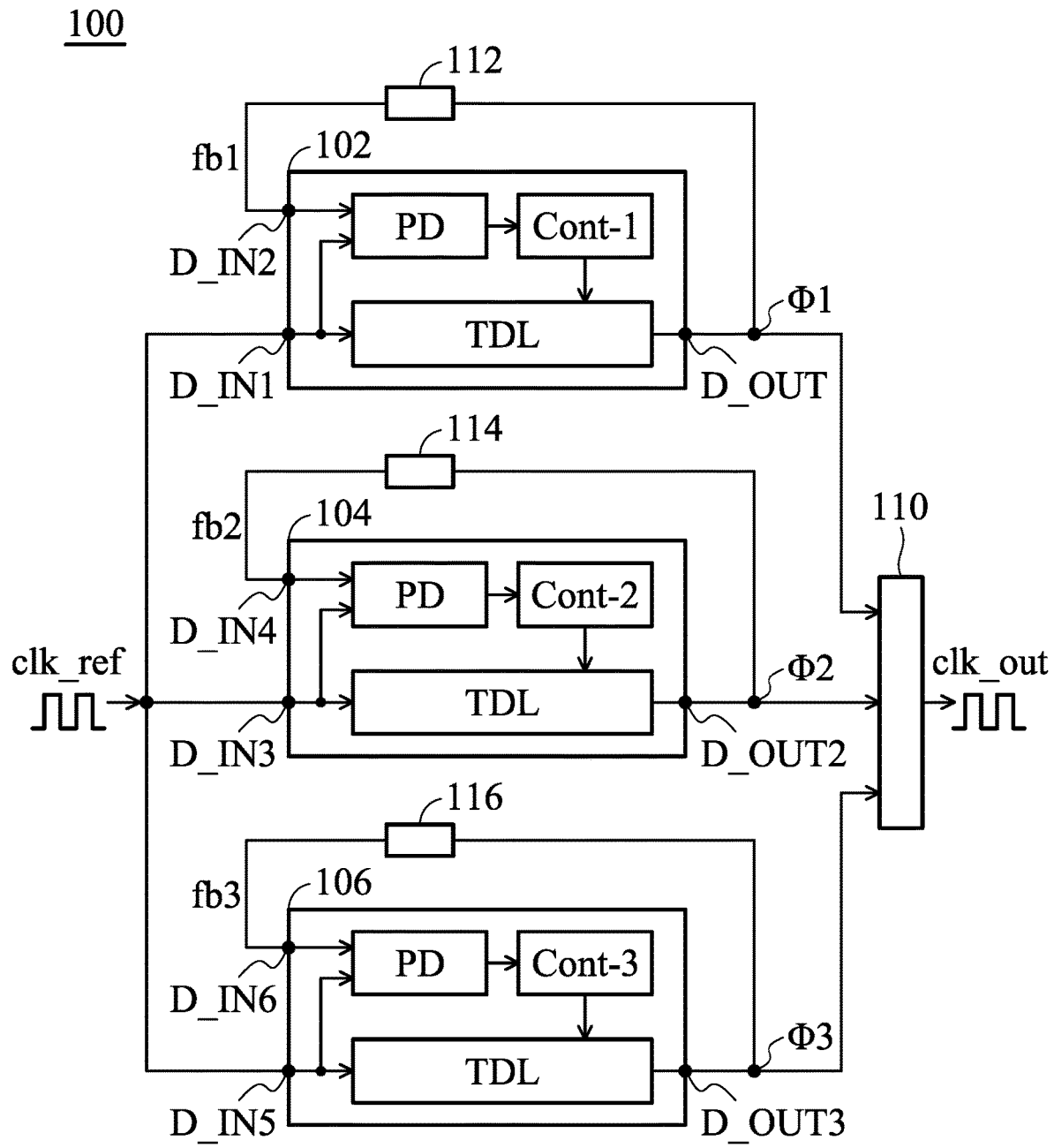
FIG. 1 is a block diagram of an electronic device 100 in accordance with some embodiments of the disclosure.

FIG. 1 is a block diagram of an electronic device 100 in accordance with some embodiments of the disclosure. As shown in FIG. 1, the electronic device 100 includes a delay-locked loop 102, a delay-locked loop 104, a delay-locked loop 106, a voter circuit 110, a dummy voter circuit 112, a dummy voter circuit 114, and a dummy voter circuit 116. In some embodiments, each of delay-locked loops 102, 104, and 106 has two inputs end and one output end. For example, the delay-locked loop 102 has an input end D_IN1, an input end D_IN2, and an output end D_OUT. The delay-locked loop 104 has an input end D_IN3, an input end D_IN4, and an output end D_OUT2. The delay-locked loop 106 has an input end D_IN5, an input end D_IN6, and an output end D_OUT3.

In some embodiments, the delay-locked loop 102 maintains a phase difference (for example, a phase difference $\Delta\theta_1$) between a reference clock signal (clk_ref) received from the input end D_IN1 and an intermediate clock signal $\phi1$ output from the output end D_OUT. Similarly, the delay-locked loop 104 maintains a phase difference (for example, a phase difference $\Delta\theta_2$) between the reference clock signal (clk_ref) received from the input end D_IN3 and an intermediate clock signal $\phi2$ output from the output end D_OUT2. The delay-locked loop 106 maintains a phase difference (for example, a phase difference $\Delta\theta_3$) between the reference clock signal (clk_ref) received from the input end D_IN5 and an intermediate clock signal $\phi3$ output from the output end D_OUT3. In other words, the phase difference $\Delta\theta_1$ is able to compensate for the phase delay (for example, $\Delta\theta_{voter1}$) caused by the intermediate clock signal $\phi1$ passing through the voter circuit 110. The phase difference $\Delta\theta_2$ is able to compensate for the phase delay (for example, $\Delta\theta_{voter2}$) caused by the intermediate clock signal $\phi2$ passing through the voter circuit 110. Moreover, the phase difference $\Delta\theta_3$ is able to compensate for the phase delay (for example, $\Delta\theta_{voter3}$) caused by the intermediate clock signal $\phi3$ passing through the voter circuit 110.

The dummy voter circuit 112 is connected between the input end D_IN2 and the output end D_OUT of the delay-locked loop 102 to delay the phase of the intermediate clock signal $\phi1$ by the phase difference $\Delta\theta_1$, and to generate a compensate clock signal fb1 to the input end D_IN2 of the delay-locked loop 102. The dummy voter circuit 114 is connected between the input end D_IN4 and the output end D_OUT2 of the delay-locked loop 104 to delay the phase of the intermediate clock signal $\phi2$ by the phase difference $\Delta\theta_2$, and to generate a compensate clock signal fb2 to the input end D_IN4 of the delay-locked loop 104. Similarly, the dummy voter circuit 116 is connected between the input end D_IN6 and the output end D_OUT3 of the delay-locked loop 106 to delay the phase of the intermediate clock signal $\phi3$ by the phase difference $\Delta\theta_3$, and to generate a compensate clock signal fb3 to the input end D_IN6 of the delay-locked loop 106.

In some embodiments, the voter circuit 110 receives the intermediate clock signal $\phi1$ from the delay-locked loop 102, the intermediate clock signal ϕ2 from the delay-locked loop 104, and the intermediate clock signal ϕ3 from the delay-locked loop 106. After that, the voter circuit 110 outputs an output clock signal (clk_out) according to the logic of the intermediate clock signals ϕ1, ϕ2, and ϕ3. Due to the characteristics of the delay-locked loops 102, 104, and 106, the reference clock signal (clk_ref) is in-phase with the compensate clock signals fb1, fb2, and fb3. Because the phase difference $\Delta\theta_1$ between the intermediate clock signal ϕ1 and the compensate clock signal fb1 is the same as the phase delay $\Delta\theta_{voter1}$ between the output clock signal (clk_out) and the intermediate clock signal ϕ1, the phase difference $\Delta\theta_2$ between the intermediate clock signal ϕ2 and the compensate clock signal fb2 is the same as the phase delay $\Delta\theta_{voter2}$ between the output clock signal (clk_out) and the intermediate clock signal ϕ2, and the phase difference $\Delta\theta_3$ between the intermediate clock signal ϕ3 and the compensate clock signal fb3 is the same as the phase delay $\Delta\theta_{voter3}$ between the output clock signal (clk_out) and the intermediate clock signal ϕ3, no matter which intermediate clock signal is selected by the voter circuit 110, the output clock signal (clk_out) is in-phase with the reference clock signal (clk_ref).

Figure 2:
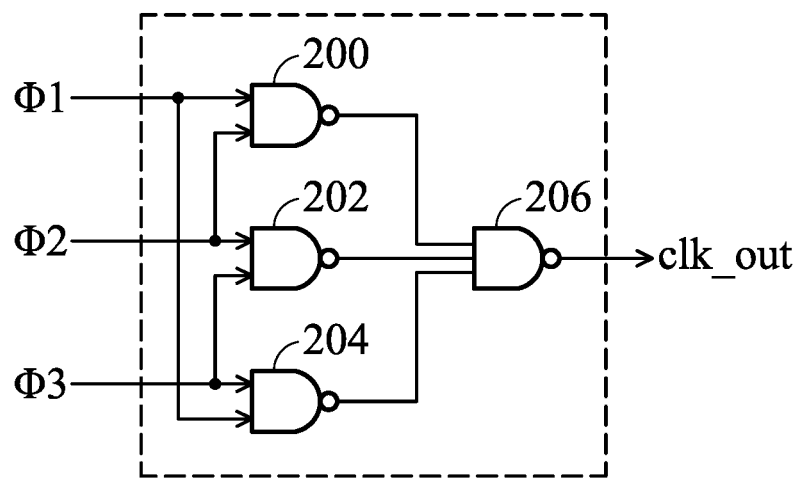
FIG. 2 is a schematic diagram of a voter circuit 110 in FIG. 1 in accordance with some embodiments of the disclosure.

FIG. 2 is a schematic diagram of a voter circuit 110 in FIG. 1 in accordance with some embodiments of the disclosure. As shown in FIG. 2, the voter circuit 110 includes a NAND gate 200, a NAND gate 202, a NAND gate 204, and a NAND gate 206. In some embodiments, the output ends of the NAND gate 200, the NAND gate 202, and the NAND gate 204 are connected to the input ends of the NAND gate 206. The NAND gate 200 receives the intermediate clock signals ϕ1 and ϕ2 from the delay-locked loops 102 and 104. The NAND gate 202 receives the intermediate clock signals ϕ2 and ϕ3 from the delay-locked loops 104 and 106. The NAND gate 204 receives the intermediate clock signals ϕ3 and ϕ1 from the delay-locked loops 106 and 102. The NAND gate 206 outputs the output clock signal (clk_out) according to the logics of the intermediate clock signals ϕ1, ϕ2, and ϕ3.

In some embodiments, the logical equation between the intermediate clock signals ϕ1, ϕ2, and ϕ3 and the output clock signal (clk_out) is equal to:

$$\text{clk\_out}=\phi1*\phi2+\phi2*\phi3+\phi3*\phi1 \quad \text{equation 1}$$

clk_out is the logic of the output clock signal. ϕ1 is the logic of the intermediate clock signal from the delay-locked loop 102. ϕ2 is the logic of the intermediate clock signal from the delay-locked loop 104. ϕ3 is the logic of the intermediate clock signal from the delay-locked loop 106. According to the equation 1 as shown above, the voter circuit 110 outputs a logic high signal (for example, "1") only when more than two intermediate clock signals are logic high signals. For example, the voter circuit 110 outputs the logic high signal (for example, "1") only when the intermediate clock signals ϕ1 and ϕ2, or the intermediate clock signals ϕ2 and ϕ3, or the intermediate clock signals ϕ3 and ϕ1, or the intermediate clock signals ϕ1, ϕ2 and ϕ3 are the logic high signals.

Figure 3:
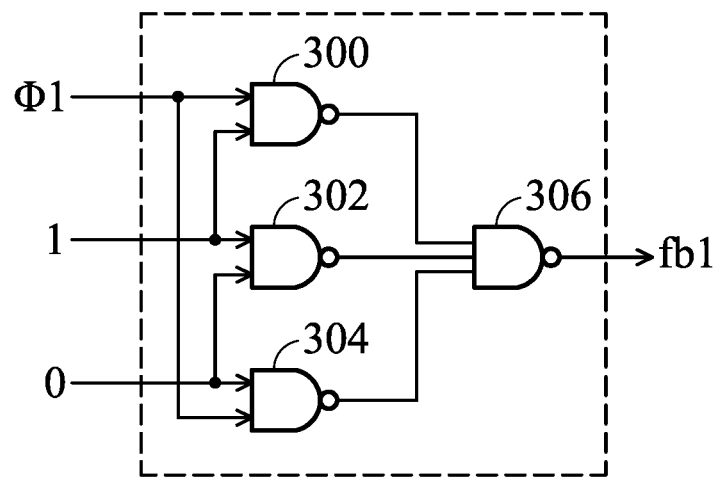
FIG. 3 is a schematic diagram of a dummy voter circuit 112 in FIG. 1 in accordance with some embodiments of the disclosure.

FIG. 3 is a schematic diagram of a dummy voter circuit 112 in FIG. 1 in accordance with some embodiments of the disclosure. As shown in FIG. 3, the dummy voter circuit 112 includes a NAND gate 300, a NAND gate 302, a NAND gate 304, and a NAND gate 306. The output ends of the NAND gates 300, 302, and 304 are connected to the input ends of the NAND gate 306. The NAND gate 300 receives the intermediate clock signal ϕ1 from the delay-locked loop 102 and a logic high signal (1). The NAND gate 302 receives the logic high signal (1) and a logic low signal (0). The NAND gate 304 receives the logic low signal (0) and the intermediate clock signal ϕ1 from the delay-locked loop 102. The NAND gate 306 outputs the compensate clock signal fb1 to the input end D_IN2 of the delay-locked loop 102 according to the logic of the intermediate clock signal ϕ1 from the delay-locked loop 102.

Because the internal logical circuit of the dummy voter circuit 112 is the same as that of the voter circuit 110, the logical equation between the intermediate clock signals ϕ1, the logic high signal (1), the logic low signal (0), and the compensate clock signal fb1 is equal to:

$$fb1=\phi1*1+1*0+0*\phi1=1 \quad \text{equation 2}$$

Therefore, the logic of the intermediate clock signals ϕ1 dominants the logic of the compensate clock signal fb1 according to the equation 2. The phase difference $\Delta\theta_1$ caused by the intermediate clock signal ϕ1 passing through the dummy voter circuit 112 (that is, passing through the NAND gates 300 and 306) to become the compensate clock signal fb1 is the same as the phase delay $\Delta\theta_{voter1}$ caused by the intermediate clock signal ϕ1 passing through the voter circuit 110.

Figure 4:
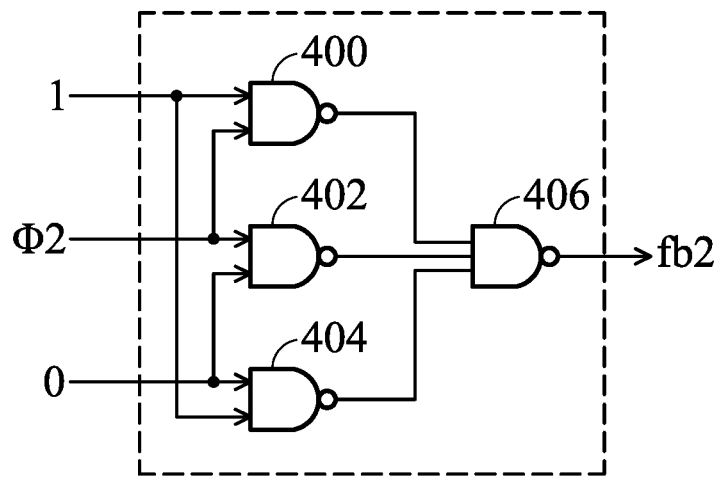
FIG. 4 is a schematic diagram of a dummy voter circuit 114 in FIG. 1 in accordance with some embodiments of the disclosure.

FIG. 4 is a schematic diagram of a dummy voter circuit 114 in FIG. 1 in accordance with some embodiments of the disclosure. As shown in FIG. 4, the dummy voter circuit 114 includes a NAND gate 400, a NAND gate 402, a NAND gate 404, and a NAND gate 406. The output ends of the NAND gates 400, 402, and 404 are connected to the input ends of the NAND gate 406. The NAND gate 400 receives the logic high signal (1) and the intermediate clock signal ϕ2 from the delay-locked loop 104. The NAND gate 402 receives the intermediate clock signal ϕ2 from the delay-locked loop 104 and the logic low signal (0). The NAND gate 404 receives the logic low signal (0) and the logic high signal (1). The NAND gate 406 outputs the compensate clock signal fb2 to the input end D_IN4 of the delay-locked loop 104 according to the logic of the intermediate clock signal ϕ2 from the delay-locked loop 104.

Because the internal logical circuit of the dummy voter circuit 114 is the same as that of the voter circuit 110, the logical equation between the logic high signal (1), the intermediate clock signals ϕ2, the logic low signal (0), and the compensate clock signal fb2 is equal to:

$$fb2=1*\phi2+\phi2*0+0*1=\phi2 \quad \text{equation 3}$$

Therefore, the logic of the intermediate clock signals ϕ2 dominants the logic of the compensate clock signal fb2 according to the equation 3. The phase difference $\Delta\theta_2$ caused by the intermediate clock signal ϕ2 passing through the dummy voter circuit 114 (that is, passing through the NAND gates 402 and 406) to become the compensate clock signal fb2 is the same as the phase delay $\Delta\theta_{voter2}$ caused by the intermediate clock signal ϕ2 passing through the voter circuit 110.

Figure 5:
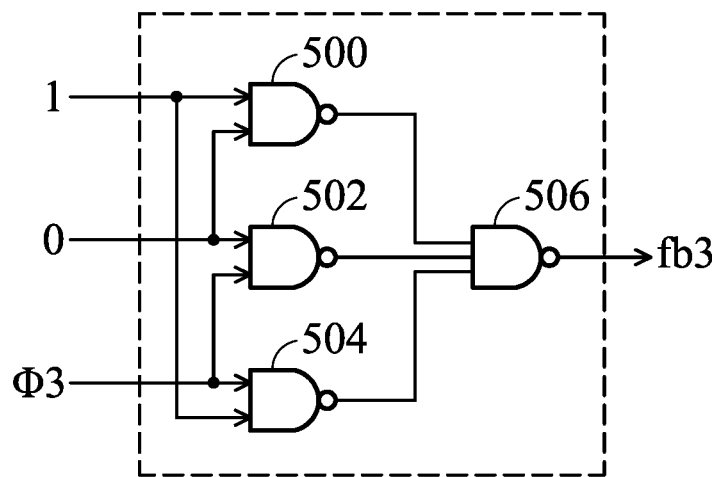
FIG. 5 is a schematic diagram of a dummy voter circuit 116 in FIG. 1 in accordance with some embodiments of the disclosure.

FIG. 5 is a schematic diagram of a dummy voter circuit 116 in FIG. 1 in accordance with some embodiments of the disclosure. As shown in FIG. 5, the dummy voter circuit 116 includes a NAND gate 500, a NAND gate 502, a NAND gate 504, and a NAND gate 506. The output ends of the NAND gates 500, 502, and 504 are connected to the input ends of the NAND gate 506. The NAND gate 500 receives the logic high signal (1) and the logic low signal (2). The NAND gate 502 receives the logic low signal (0) and the intermediate clock signal ϕ3 from the delay-locked loop 106. The NAND fate 504 receives the intermediate clock signal ϕ3 from the delay-locked loop 106 and the logic high signal (1). The NAND gate 506 outputs the compensate clock signal fb3 to the input end D_IN6 of the delay-locked loop 106 according to the logic of the intermediate clock signal ϕ3 from the delay-locked loop 106.

Because the internal logical circuit of the dummy voter circuit 116 is the same as that of the voter circuit 110, the logical equation between the logic high signal (1), the logic low signal (0), the intermediate clock signals ϕ3, and the compensate clock signal fb3 is equal to:

$$fb3 = 1*0 + 0*\phi3 + \phi3*1 = \phi3 \qquad \text{equation 4}$$

Therefore, the logic of the intermediate clock signals ϕ3 dominants the logic of the compensate clock signal fb3 according to the equation 4. The phase difference $\Delta\theta_3$ caused by the intermediate clock signal ϕ3 passing through the dummy voter circuit 116 (that is, passing through the NAND gates 504 and 506) to become the compensate clock signal fb3 is the same as the phase delay $\Delta\theta_{voter3}$ caused by the intermediate clock signal ϕ3 passing through the voter circuit 110.

Back to FIG. 1, each of the delay-locked loops 102, 104, and 106 has a phase detector (PD), a controller (Cont-1, Cont-2, or Cont-3), and a tunable delay line (TDL). In some embodiments, the phase detector (PD) of the delay-locked loop 102 compares the phase difference between the reference clock signal (clk_ref) and the compensate clock signal fb1, and outputs an indication signal to the controller (Cont-1) according to the comparison result. Similarly, the phase detector (PD) of the delay-locked loop 104 compares the phase difference between the reference clock signal (clk_ref) and the compensate clock signal fb2, and outputs an indication signal to the controller (Cont-2) according to the comparison result. The phase detector (PD) of the delay-locked loop 106 compares the phase difference between the reference clock signal (clk_ref) and the compensate clock signal fb3, and outputs an indication signal to the controller (Cont-3) according to comparison results.

In some embodiments, the indication signal uses a bit to show that the phase of the reference clock signal (clk_ref) leads or lags behind that of the compensate clock signal (for example, the compensate clock signal fb1, fb2, or fb3). For example, if the phase of the reference clock signal (clk_ref) leads that of the compensate clock signal fb1, the phase detector (PD) of the delay-locked loop 102 outputs the logic high signal to the controller (Cont-1). If the phase of the reference clock signal (clk_ref) lags behind that of the compensate clock signal fb1, the phase detector (PD) of the delay-locked loop 102 outputs the logic low signal to the controller (Cont-1).

The controller (Cont-1, Cont-2, or Cont-3) of each of the delay-locked loops 102, 104, and 106 outputs a control code according to the indication signal from the corresponding phase detector. The tunable delay line (TDL) of each of the delay-locked loops 102, 104, and 106 delays the reference clock signal (clk_ref) according to the control code to generate the intermediate clock signal (for example, the intermediate clock signal ϕ1, ϕ2, or ϕ3), and the intermediate clock signal is then output from the output end of the delay-locked loops 102, 104, or 106.

Figure 6:
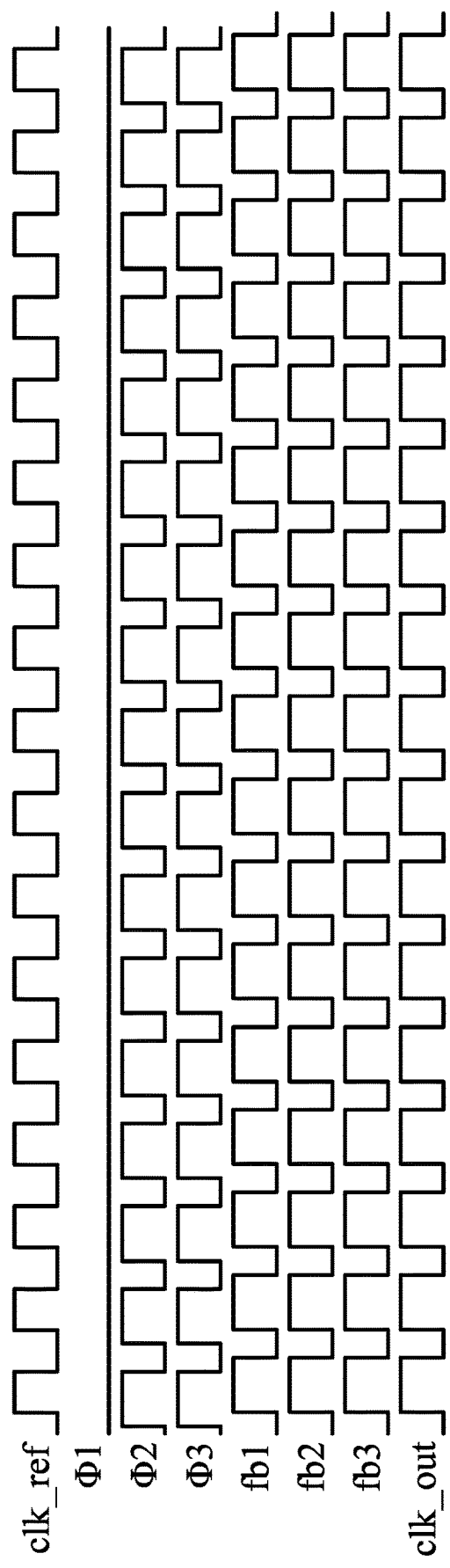
FIG. 6 is a timing diagram of a reference clock signal (clk_ref), intermediate clock signals ($\phi1$, $\phi2$, $\phi3$), compensate clock signals (fb1,fb2,fb3), and an output clock signal (clk_out) in the electronic device 100 in scenario 1 in accordance with some embodiments of the disclosure.

FIG. 6 is a timing diagram of a reference clock signal (clk_ref), intermediate clock signals (ϕ1, ϕ2, ϕ3), compensate clock signals (fb1, fb2, fb3), and an output clock signal (clk_out) in the electronic device 100 in scenario 1 in accordance with some embodiments of the disclosure. As shown in FIG. 6, in the scenario 1, the intermediate clock signal ϕ1 is always stuck at logic low level (for example, "0"). However, despite the intermediate clock signal ϕ1 is stuck at logic low level, the false status of the intermediate clock signal ϕ1 may be filtered out by the logical structure of the voter circuit 110. In detail, because the intermediate clock signal ϕ1 is stuck at logic low level, the voter circuit 110 outputs the logic high level only when both the intermediate clock signals ϕ2 and ϕ3 are logic high level (according to the equation 1). Thus, the output clock signal (clk_out) is also in-phase with the reference clock signal (clk_ref), and the false status of the intermediate clock signal ϕ1 is neglected. In addition, the phase delay between the intermediate clock signal (ϕ1, ϕ2, or ϕ3) and the output clock signal (clk_out) can also be compensated by the dummy voter circuit (112, 114, or 116) in FIG. 1.

Figure 7:
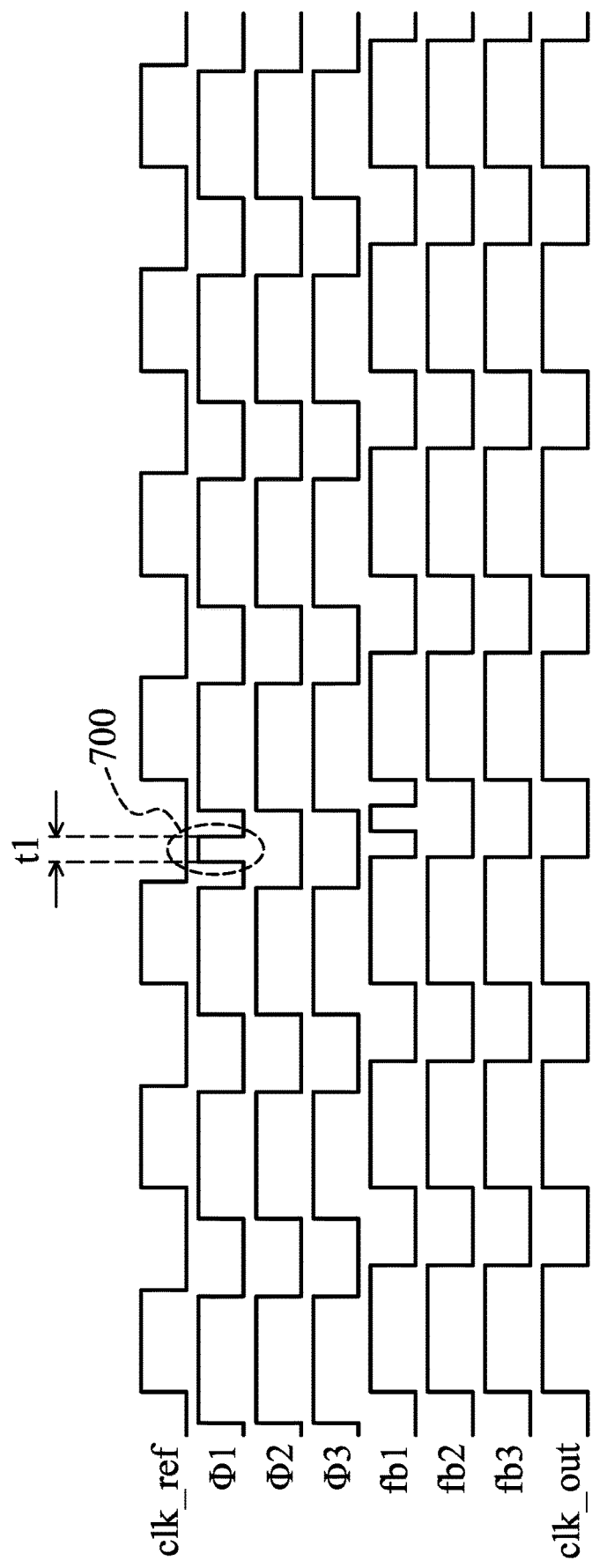
FIG. 7 is a timing diagram of the reference clock signal (clk_ref), the intermediate clock signals ($\phi1$, $\phi2$, $\phi3$), the compensate clock signals (fb1,fb2,fb3), and the output clock signal (clk_out) in the electronic device 100 in scenario 2 in accordance with some embodiments of the disclosure.

FIG. 7 is a timing diagram of the reference clock signal (clk_ref), the intermediate clock signals (ϕ1, ϕ2, ϕ3), the compensate clock signals (fb1, fb2, fb3), and the output clock signal (clk_out) in the electronic device 100 in scenario 2 in accordance with some embodiments of the disclosure. As shown in FIG. 7, in the scenario 2, there is a pulse error 700 (for example, an interference signal) on the intermediate clock signal ϕ1 in time period t1. However, the pulse error 700 can also be filtered out by the voter circuit 110 in FIG. 1. In detail, in time period t1, both intermediate clock signals ϕ2 and ϕ3 are logic low level, thus the voter circuit 110 outputs logic low level in time period t1, and the pulse error 700 on the intermediate clock signal ϕ1 in time period t1 can also be neglected. In addition, the phase delay between the intermediate clock signal (ϕ1, ϕ2, or ϕ3) and the output clock signal (clk_out) can also be compensated by the dummy voter circuit (112, 114, or 116) in FIG. 1.

The ordinals in the specification and the claims of the present invention, such as "first", "second", "third", etc., have no sequential relationship, and are just for distinguishing between two different components with the same name. In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. An electronic device, comprising:
    three delay-locked loops, each of which has a first input end, a second input end, and an output end to maintain a phase difference between a reference clock signal received from the first input end and an intermediate clock signal output from the output end;
    three dummy voter circuits, each of which is connected between the second input end and the output end of each of the three delay-locked loops to delay the phase of the intermediate clock signal by the phase difference;
    a voter circuit, receiving the intermediate clock signal from each of the three delay-locked loops, and outputting an output clock signal according to the logic of the intermediate clock signal from each of the three delay-locked loops;
    wherein the phase difference compensates for the phase delay caused by the intermediate clock signal passing through the voter circuit, so that the output clock signal is synchronized with the reference clock signal.

2. The electronic device as claimed in claim 1, wherein the voter circuit outputs a logic high signal only when more than two intermediate clock signals from the three delay-locked loops are logic high signals.

3. The electronic device as claimed in claim 1, wherein the three delay-locked loops comprise a first delay-locked loop, a second delay-locked loop and a third delay-locked loop; the three dummy voter circuits comprise a first dummy voter circuit, a second dummy voter circuit, and a third dummy voter circuit; and the voter circuit comprises a first NAND gate, a second NAND gate, a third NAND gate, and a fourth NAND gate.

4. The electronic device as claimed in claim 3, wherein all the output ends of the first NAND gate, the second NAND gate, and the third NAND gate are connected to the input ends of the fourth NAND gate.

5. The electronic device as claimed in claim 3, wherein the first NAND gate receives the intermediate clock signals from the first delay-locked loop and the second delay-locked loop; the second NAND gate receives the intermediate clock signals from the second delay-locked loop and the third delay-locked loop; and the third NAND gate receives the intermediate clock signals from the first delay-locked loop and the third delay-locked loop.

6. The electronic device as claimed in claim 3, wherein the fourth NAND gate outputs the output clock signal according to the logics of the intermediate clock signals from the first delay-locked loop, the second delay-locked loop, and the third delay-locked loop.

7. The electronic device as claimed in claim 3, wherein the logical equation between the intermediate clock signals and the output clock signal is equal to:

$$clk\_out=\phi1*\phi2+\phi2*\phi3+\phi3*\phi1$$

wherein clk_out is the logic of the output clock signal; $\phi1$ is the logic of the intermediate clock signal from the first delay-locked loop; $\phi2$ is the logic of the intermediate clock signal from the second delay-locked loop $\phi3$ is the logic of the intermediate clock signal from the third delay-locked loop.

8. The electronic device as claimed in claim 3, wherein the first dummy voter circuit is connected between the second input end and the output end of the first delay-locked loop; the second dummy voter circuit is connected between the second input end and the output end of the second delay-locked loop; and the third dummy voter circuit is connected between the second input end and the output end of the third delay-locked loop.

9. The electronic device as claimed in claim 8, wherein each of the first dummy voter circuit, the second dummy voter circuit, and the third dummy voter circuit comprises: a fifth NAND gate, a sixth NAND gate, a seventh NAND gate, and an eighth NAND gate.

10. The electronic device as claimed in claim 9, wherein all the output ends of the fifth NAND gate, the sixth NAND gate, and the seventh NAND gate are connected to the input ends of the eighth NAND gate.

11. The electronic device as claimed in claim 9, wherein the fifth NAND gate of the first dummy voter circuit receives the intermediate clock signal from the first delay-locked loop and a logic high signal; the sixth NAND gate of the first dummy voter circuit receives the logic high signal and a logic low signal; and the seventh NAND gate of the first dummy voter circuit receives the intermediate clock signal from the first delay-locked loop and the logic low signal.

12. The electronic device as claimed in claim 9, wherein the fifth NAND gate of the second dummy voter circuit receives the intermediate clock signal from the second delay-locked loop and a logic high signal; the sixth NAND gate of the second dummy voter circuit receives the intermediate clock signal from the second delay-locked loop and a logic low signal; and the seventh NAND gate of the second dummy voter circuit receives the logic high signal and the logic low signal.

13. The electronic device as claimed in claim 9, wherein the fifth NAND gate of the third dummy voter circuit receives a logic high signal and a logic low signal; the sixth NAND gate of the third dummy voter circuit receives the logic low signal and the intermediate clock signal from the third delay-locked loop; and the seventh NAND gate of the third dummy voter circuit receives the logic high signal and the intermediate clock signal from the third delay-locked loop.

14. The electronic device as claimed in claim 11, wherein the eighth NAND gate of the first dummy voter circuit outputs a first compensate clock signal to the second input end of the first delay-locked loop according to the logic of the intermediate signal from the first delay-locked loop; the eighth NAND gate of the second dummy voter circuit outputs a second compensate clock signal to the second input end of the second delay-locked loop according to the logic of the intermediate signal from the second delay-locked loop; and the eighth NAND gate of the third dummy voter circuit outputs a third compensate clock signal to the second input end of the third delay-locked loop according to the logic of the intermediate signal from the third delay-locked loop.

15. The electronic device as claimed in claim 1, wherein each of the three delay-locked loops comprises:
a phase detector, comparing phases between the reference clock signal and a compensate clock signal, and outputting an indication signal according to a comparison result; wherein the compensate signal is a signal which is obtained after one of the dummy voter circuits delays the intermediate clock signal by the phase difference;
a controller, outputting a control code according to the indication signal;
a tunable delay line, delaying the reference clock signal according to the control code to generate the intermediate clock signal.

16. The electronic device as claimed in claim 15, wherein the indication signal uses a bit to show that the phase of the reference clock signal leads or lags behind that of the compensate clock signal.

17. The electronic device as claimed in claim 3, wherein the phase delay of the intermediate clock signal from the first delay-locked loop passing through the voter circuit is the same as that of the intermediate clock signal from the first delay-locked loop passing through the first dummy voter circuit; the phase delay of the intermediate clock signal from the second delay-locked loop passing through the voter circuit is the same as that of the intermediate clock signal from the second delay-locked loop passing through the second dummy voter circuit; and the phase delay of the intermediate clock signal from the third delay-locked loop passing through the voter circuit is the same as that of the intermediate clock signal from the third delay-locked loop passing through the third dummy voter circuit.

* * * * *